United States Patent [19]

Eckhaus et al.

[11] Patent Number: 4,823,089
[45] Date of Patent: Apr. 18, 1989

[54] BURGLAR ALARM FAULT DETECTOR

[76] Inventors: Yehudah Z. Eckhaus, 3221 Skillman Ave., Oceanside, N.Y. 11572; Ira Eckhaus, 810 E. 3rd St., Brooklyn, N.Y. 11218

[21] Appl. No.: 47,774
[22] Filed: May 8, 1987
[51] Int. Cl.$^4$ ............................................. G01R 31/02
[52] U.S. Cl. .................................. 324/525; 324/556; 340/506
[58] Field of Search .................. 324/525, 555, 556; 340/507, 506

[56] References Cited

U.S. PATENT DOCUMENTS

| | | | |
|---|---|---|---|
| 3,729,734 | 4/1973 | Kipling | 340/506 |
| 4,163,936 | 8/1979 | Shufro | 324/525 |
| 4,298,969 | 11/1981 | Rickenbacher | 324/525 |
| 4,348,661 | 9/1982 | Lucchesi | 340/506 |

Primary Examiner—Reinhard J. Eisenzopf
Assistant Examiner—Maura K. Regan
Attorney, Agent, or Firm—Helfgott & Karas

[57] ABSTRACT

A burglar alarm fault detector for aiding in the detection of faults including intermittent faults within a burglar alarm circuit. The circuit includes low and high end adjustments for setting the values of the measured resistance above and below the actual resistance of the burglar alarm circuit. At each of these set values an alarm will sound. The alarm sounded from the high adjustment can be distinguished from that of the low adjustment.

11 Claims, 3 Drawing Sheets

BURGLAR ALARM FAULT DETECTOR

BACKGROUND OF THE INVENTION

This invention relates to burglar alarm servicing equipment, and more particularly to an apparatus for aiding in the detection of circuit faults in a burglar alarm system.

A typical burglar alarm system includes a closed loop circuit path that extends throughout a premises being protected. The circuit loop would generally include burglar alarm tapes along windows and doors, burglar alarm switches at various locations, and might also include vibration detectors and other type of sensors to detect unauthorized entry. All of these sensors and tapes are then interconnected into a complete closed loop path. An alarm is placed within the path and the ends of the path are connected to the alarm circuit terminals which derive power from either house current or battery power during emergency times. When an unauthorized entry occurs, a break in the tape will open the circuit, or one of the sensors will open, to open the circuit. Such opening of the circuit causes the alarm to sound.

After installation, as a result of environmental conditions, deterioration and the like, parts of the circuit may accidentally break and false alarms occur. When a full break occurs, typically a service repairman will use a continuity tester to find the breakage in the circuit in order to repair it. By measuring the resistance across various points in the circuit with an ohmmeter and the like, it is possible to detect which part of the circuit has the infinite resistance, thereby representing an open circuit giving an indication of a breakage.

More frequently, however, short intermittent breaks called "swingers" may occur. Such "swingers" may not occur for months at a time and may last only a second or so when they do. They may show up only when wind rattles a window, opening a hairline crack in a foil loop, or when wood swells or shrinks, causing electrical contacts to part. Frayed wires or loose connections can momentarily separate due to vibration or temperature changes, then "heal" themselves later, giving no clue to the trouble. A thin film of dirt or corrosion could also be the reason for intermittent contact failure. The alarm may accidentally go off and then stop by itself. The loose connection, or partial break, will cause sounding of the alarm when armed or intermittent circuit reading on a meter or LED circuit indicator.

Servicemen find it difficult to locate such swingers because of their intermittent action. In order to detect such swingers, the service repairman will typically connect an ohmmeter or other type of resistance measuring device across the two entry points into the circuit line at their connection to the alarm circuit loop terminals. When connecting an ohmmeter to the alarm circuit loop, the circuit wires are removed from the alarm circuit loop terminals. Resistance is measured across the alarm circuit loop only. The repairman must then proceed around the entire premises manually shaking or moving each of the switches, wires, detectors, and sensors. As each one is manually moved or adjusted, the serviceman must return to the ohmmeter and see if there occurred an increase or decrease in the reading of the meter. Typically, the resistance should drop. However, occasionally it may increase, especially if there are more than one such swingers in the line. Many times, however, the resistance reading in a circuit containing an intermittent break, will read satisfactorily across the two entry points. Many swingers swing too fast to be detected using the methods used today.

However, for detecting each sensor that is moved or adjusted, he must again go back to the ohmmeter. For this reason, typically, two people are necessary in order to test a burglar alarm system having swingers present in the circuit. One person proceeds throughout the premises testing the wires and switches while the other monitors the readout at the ohmmeter.

Because of the difficulty detecting such swingers requiring inconvenience for one person to test and thereby necessitating the presence of two individuals, there is need for an improvement in the apparatus and methods utilized for detecting such burglar alarm faults.

SUMMARY OF THE INVENTION

It is accordingly an object of the present invention to provide a burglar alarm fault detector which avoids the problems of prior art devices.

Another object of the present invention is to provide an apparatus which can be utilized to easily detect the presence of swingers within a burglar alarm circuit.

Still a further object of the present invention is to provide an apparatus which can be used to aid a service repairman or homeowner in detecting faults that may be present within a closed loop burglar alarm system including those of the swinger types.

Another object of the present invention is to provide an apparatus which provides an audible indication of changes in the resistance of a closed loop burglar alarm system.

A further object of the present invention is to provide an apparatus which can be preset at desired values for detection of increased or decreased resistance of a burglar alarm system and provides an audible output at the occurrence of such change in the resistance.

Briefly, in accordance with the present invention, there is provided a burglar alarm fault detector which includes a circuit contained within a housing. Input terminals on the housing are available for connection across the burglar alarm system, typically at its main connection to the power source. The entry points into the circuit are disconnected during such measurement.

Within the housing is contained circuitry for detecting the resistance through the burglar alarm circuit across the input terminals. An alarm is included within the housing such as a piezoelectric crystal. The circuit includes both low and high end adjustment arrangements for setting the circuits such that the alarm will sound at a resistance value above and below an initially measured resistance value.

An ohmmeter can be plugged into the housing or, the device can be built into a multimeter for measuring the resistance detected. Alternately, the ohmmeter can be built directly into the housing itself. The alarm can be adjusted to distinguish between a resistance above the initially measured value or below. The amount of resistance above or below can be preset to desired amounts.

With the present invention, the apparatus is utilized to initially measure the resistance across the burglar alarm circuit. The apparatus is then adjusted for a desired amount of resistance above the initially measured value and a desired amount of resistance below the initially measured valve. The alarm is set to sound at those desired values above and below the initially measured resistance value. The serviceman then proceeds around the premises checking by vibration or movement each of the switches and sensors and when he audibly hears the sound from the apparatus he knows a fault has been found.

A delay function can be built into the system to hold the sound longer than just the momentary closing of the intermittent break or switch. The intermittent break exists only momentarily, a fraction of a second, only enough to set off the alarm. The delay function will prolong the tone, after the momentary break, or intermittent, breaks the circuit. This will keep the sound coming from the device long enough for the serviceman to get closer to the burglar alarm fault detector to hear the tone if a swinger is detected should he be out of its audible sound range.

The delay also serves to prolong the time gap of a momentary swinger that ordinarily may not be picked up on a meter or other measuring device and make it audible. The audible sounds can be made variable in length of time by changing component values.

The aforementioned objects, features and advantages of the invention will, in part, be pointed out with particularity and will, in part, become obvious from the following more detailed description of the invention taken in conjunction with the accompanying drawing which forms an integral part thereof.

BRIEF DESCRIPTION OF THE DRAWING

In the drawings.

In the various figures of the drawing, like reference characters designate like parts.

DETAILED DESCRIPTION OF THE INVENTION

Figure 1:
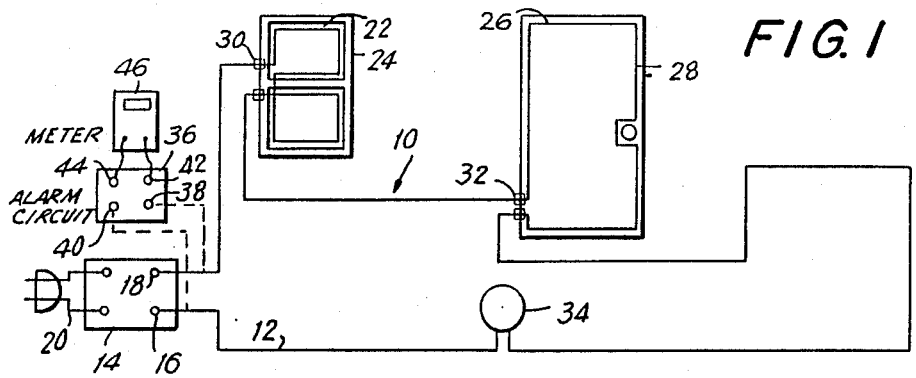
FIG. 1 is a schematic view showing a burglar alarm system connected across a premises and schematically showing the interconnection of the apparatus of the present invention to the system for measurement of a fault.

A typical burglar alarm circuit is shown generally at 10 in FIG. 1 and includes wiring 12 which extends around the premises from a main terminal block 14 having terminals 16, 18 to which the wire is connected. The other end of the terminal block has a plug 20 which is connected to a power source and would be internally connected to the terminals 16 and 18 to energize the burglar alarm circuit.

Included within the burglar alarm system are tapes 22 connected around a window 24 as well as tapes 26 connected around a door 28. Appropriate switches 30 and 32 would be connected at suitable locations such as at the windows or the doors to permit opening of the windows to a limited extent. Other types of sensors and detectors would also be included within the circuit. An alarm indicator circuit 34 is also included within the burglar alarm circuit.

In operation, when the plug 20 is inserted in the source of power, a closed loop occurs and is so arranged that the burglar alarm remains silent during such closed loop operation. However, as soon as part of the wire 12 or the tapes 22, 26 or any of the switches 30, 32 are opened, the alarm will sound.

While it is reasonable for a serviceman to detect a complete breakage, the problem occurs where there are swingers where there is intermittent sounding of the alarm. A loose wire, a weak connection, a partial break, can all cause such intermittent effect, especially when vibrations resulting from wind, and other environmental conditions continuously effect these switches and tapes.

In accordance with the present invention, there is provided an apparatus typically shown within the housing 36. A first pair of terminals 38, 40 are available for connection of the burglar alarm circuit to these terminals. The burglar alarm would be disconnected from the power source either by removal of the plug 20, or removal of the wires from the terminals 16, 18 and placed onto the terminals 38, 40. An additional pair of terminals 42, 44 are available for connection of a meter 46 for measuring the resistance. Such a meter can be an ohmmeter or a multimeter which includes an ohmmeter setting. As will hereinafter be explained, the meter 46 can be integrated within the same housing 36 of the present invention.

Figure 2:
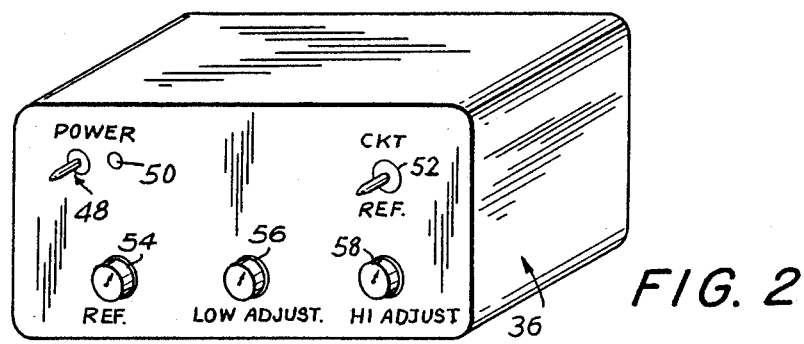
FIG. 2 is a perspective view of the front of the unit in accordance with one embodiment of the present invention.
Figure 3:
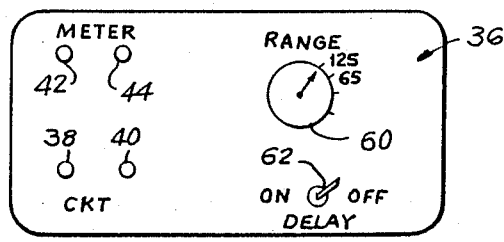
FIG. 3 is a back view of the instrument shown in FIG. 2.

The housing 36 is more clearly shown in FIGS. 2 and 3 wherein it is shown to be a rectangular shape, although other shapes could be utilized. On the front of the housing is provided a power switch 48 with an indicator 50 giving an indication when the power switch is on to the detector. On the other side is a switch 52 which can be switched between a REFERENCE position and a CIRCUIT position. Three knobs are provided on the front of the housing. Knob 54 is designated as the REFERENCE knob. Knob 56 is a LOW ADJUST knob and knob 58 is a HIGH ADJUST knob.

In the back of the housing, as shown in FIG. 3 are provided the terminals 38, 40 to which are connected the burglar alarm circuit and the terminals 42, 44 for connection to the external meter. The polarity must be met when using the meter. A range switch 60 is provided to adjust the range values of the detector to accommodate the particular type of meter being utilized. Different meters may use different voltages. The range can automatically set itself by additional circuitry to the circuitry contained in the housing 36, as well hereinafter be explained. A delay switch 62 can be switched between its ON and OFF positions to either include or exclude the prolonged tone sound in the finding of an intermittent in the alarm circuit, as will hereinafter be explained.

Figure 4:
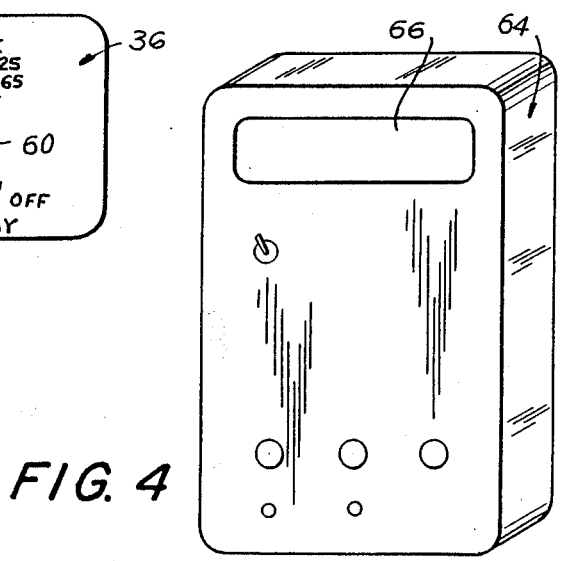
FIG. 4 is a perspective view of an alternate embodiment of the apparatus of the present invention.

FIG. 4 shows an alternate embodiment of a housing 64 which includes both a meter and the detector circuit of the present invention. The readout 66 would be present to read out the resistance value normally read on a separate meter either in analog or digital form. The meter could be a multimeter which can be used to read not only resistance but also voltage, current, and other values in the circuit. However, the circuit can be adjusted so that only when the meter is put in its ohm resistance reading position will the burglar alarm apparatus of the present invention be tied into the meter circuit. Otherwise the meter can be utilized as a standard measuring device.

Figure 5:
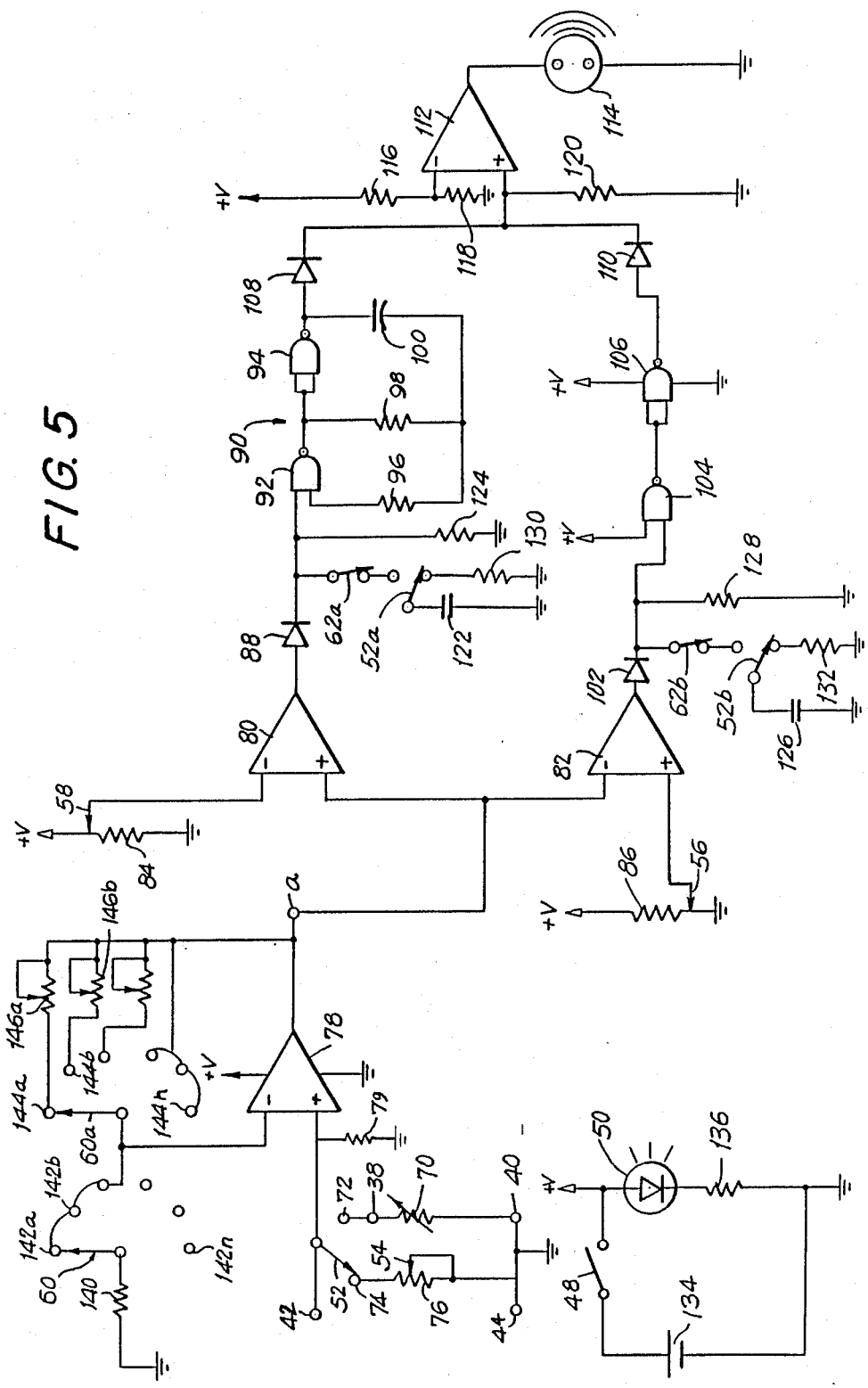
FIG. 5 is a schematic circuit diagram in accordance with one embodiment of the present invention.

Referring now to FIG. 5, there is shown an embodiment of one type of circuit which can be utilized for the burglar alarm fault detector of the present invention. The circuit would be connected to the terminals 38, 40 as heretofore explained with a variable resistor 70 connected in parallel across the circuit. The meter terminals 42, 44 are provided for connection of the meter 46 as heretofore explained. The switch 52 shown on the front of the meter switching between the circuit position 72 and the reference position 74 can either connect the burglar alarm circuit to the present apparatus or can interconnect a reference resistor 76 across the apparatus. Reference resistor 76 is adjustable by means of the adjustment knob 54 which was shown at the front of the housing.

The output from either the burglar alarm circuit when switch 52 is in position 72, or from the reference 76 when switch 52 is in position 74, passes through an integrated circuit 78 which can be part of a quad op-amp package such as the LM324 chip. The output from this op-amp 78, which serves as an amplifier, feeds one input of the two operational amplifiers 80, 82. 80 serves as the high voltage comparator and 82 serves as the low voltage comparator. Resistor 84, with its variable tap 58, as was shown at the front of the housing, serves as the high range control. Resistor 86 with its variable tap 56, as was shown at the front of the housing, serves as the low range control. Resistor 79 may be needed to prevent the input to 78 from floating.

The output from the high range amplifier 80 passes through a diode 88 to prevent backflow into the amplifier, cutting off a path of discharge for time delay capacitor 122. It then turns on oscillator 90 which can use part of a 4011 integrated circuit chip using logic gates 92 and 94. Appropriate resistances 96, 98 and capacitor 100 provide the necessary circuit to form an oscillator of a desired frequency. Various other oscillator circuits can be used.

At the output of the low operational amplifier 82, there is likewise a diode 102 to prevent backflow and there is also provided a pair of gates 104, 106 which can also be part of the same 4011 chip. Although these do not serve as an oscillator, they provide an effective equalizing delay for the circuitry of the oscillator provided at the high output so as to provide an equal effect to both the high and low output.

Diodes 108, 110 prevent further backflow and then feed the operational amplifier 112 to turn on the piezo crystal 114. Appropriate resistances 116, 118 and 120 are provided as is well known at the input of the amplifier 112.

In order to provide appropriate delays, a capacitor 122 in conjunction with a parallel resistor 124 are placed in the high range circuit. Likewise capacitor 126 in conjunction with resistor 128 are placed in the low range circuit. Ganged switches 62a and 62b correspond to the switch 62 placed at the back of the housing, as was shown in FIG. 3. These are present to include or exclude the delays. Ganged together with the switch 52 are also provided the switches 52a and 52b. Thus, when the reference resistance 76 is switched into the circuit, likewise the delays will be excluded so that during initial set up there will be no delays. The resistors 130 and 132 are provided for discharge of the capacitors during the time initial set up is taking place and the capacitors are not able to discharge through their usual resistors 124, 128.

A battery voltage source 134 can be included in series with the main power switch 48 on the unit. The indicator light 50 is connected in series with the resistor 136 and produces an output of +V for use internally of the circuit.

The range switch 60 previously shown at the back of the housing unit in FIG. 3 is provided to interconnect the resistor 140 to various tap locations 142A, 142B ... 142N. Switch 60A is ganged to switch 60 and likewise can be moved between positions 144A, 144B ... 144N thereby switching in appropriate resistances 146A, 146B ... etc.

The operation of the circuit is conducted as follows. Resistors 84 and 86 are shown with the initial condition settings of their variable taps. The burglar alarm circuit is disconnected from its power source and connected to the terminals 38, 40 of the present apparatus. A meter, if not inherently built into the unit is connected across the terminals 42, 44. Switch 52 is placed on its position 72 so as to initially measure the resistance across the circuit. Switch 52 is then moved to its reference position 74. At the same time ganged switches 52A, 52B are moved to disable the delay during such reference measurements.

The reference adjust potentiometer switch 54 is then adjusted to a desired level below the resistance value measured. By way of example, if the initial measurement of the resistance was 400 ohms, the adjustment 54 can be set so that the meter will read a level of 300 ohms. At that point the low adjustment knob 56 is adjusted until the tone sounds. At that point, the reference 54 is again adjusted to read a resistance higher than the initial resistance. Again by way of example, if the initial resistance was 400 ohms, it can be adjusted to read a value of 500 ohms. The high adjustment knob 58 is then again adjusted until the tone will sound.

In this way, during the course of the measurements, should the shaking of the swinger cause an increase or decrease of resistance past the set values of 500 or 300 ohms, the piezoelectric tone will sound. Although the setting of the values is arbitrary, typically experienced servicemen will set the resistance at a value of 50 ohms above the initial reading and 100 ohms below the reading. However, this is arbitrary to each serviceman. The reference resistance level can be set to any desired increment of resistance. Switch 52 is now set to 72 to return to the real circuit.

Because of the presence of the oscillator in the high adjustment circuit, when the high resistance occurs, the audio alarm will oscillate. Since no oscillator is present in the low adjustment circuit, the tone at the low end will sound as a constant tone. This is for the purpose of distinguishing whether it is a higher or lower resistance that has been detected without seeing the readout. The serviceman can then set up the instrument at the terminals of the circuit of the burglar alarm and go throughout the premises checking on the swingers. When a swinger has been detected, he will automatically hear the high or low adjustment resistance alarm sound and will know that a swinger has been found and will even know whether it is a high resistance that has occurred or a lower resistance that has occurred.

Should the serviceman be at great distances from the apparatus, he may want to include a delay to prolong the sound tone and to give him an opportunity to move closer to the instrument and hear the tone after checking a swinger. He can then include the delay element in the circuit.

Figure 6:
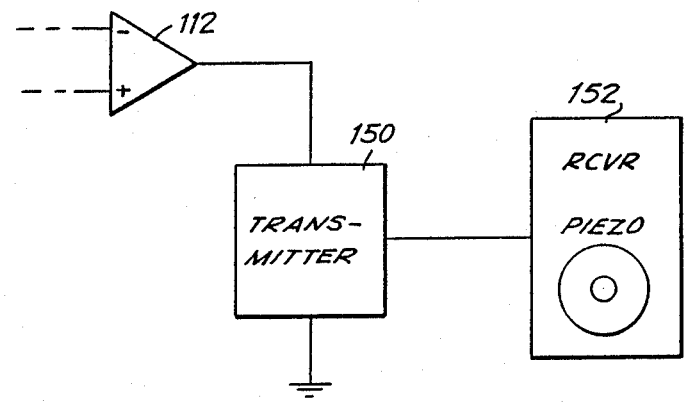
FIG. 6 is a schematic drawing of a remote control alarm, for use with the circuit of FIG. 5.

As shown in FIG. 6, instead of using the piezoelectric alarm 114 shown in FIG. 5, it is possible to connect the output of the amplifier 112 to a transmitter 150. The transmitter 150 will send a sound to a portable receiver 152 which can be carried by the serviceman and which includes an audible alarm. In this way, the receiver with the audible tone can be carried around by the serviceman as he checks for the swinger and he need not return to within the audible range of the detector each time to hear if a sound has occurred.

Figure 7:
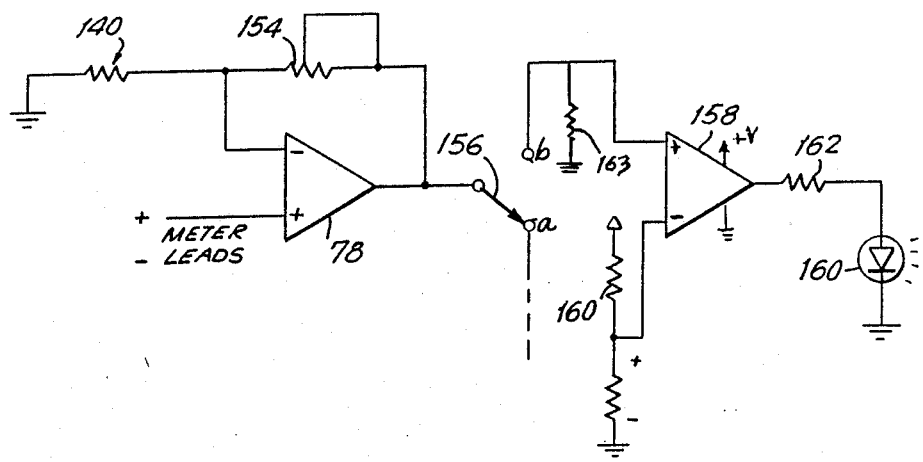
FIG. 7 is a schematic of a self determining range control for use with the circuit of FIG. 5.

As shown in FIG. 7, an alternate type of arrangement can be made in the circuit of FIG. 5 to provide automatic adjustment of the range to any meter whose range value is not exactly known. As shown, the amplifier 78 includes a variable resistor 154 which can be adjusted. The output from the amplifier 78 now includes a switch 156. For normal operations, the switch is put towards position a which corresponds to the same position point a shown in FIG. 5 and leads to the rest of the circuit. However, for providing adjustment to a meter whose range is unknown, the switch 156 is moved to position b. In this position, it feeds one input to an amplifier 158. A high value resistor 163 is connected to ground to prevent the input to amplifier 158 from floating. The other input is connected to a voltage divider 160 providing 7.5 volts, when using a 9 volt supply and an LM 324 input to the amplifier 158. This matches the value of up to 7.5 volts which comes out of the amplifier 78. The output from the amplifier 158 feeds a light indicator 160 across resistor 162.

In order to adjust the gain without knowing the exact value of the output voltage of the ohmmeter switch 56 is set to position 72, without the alarm circuit connected to terminals 38 and 40. The switch 156 is placed in position b and the adjustment made until the indicator 160 turns on. At this point, it is known that the value of the meter corresponds to the gain of the ohmmeter.

It should be appreciated, that other types of circuits could be utilized. For example, rather than use the resistance setting, a push button lock and hold could be utilized whereby a lower and higher reading could be set on a digital meter and then these values held by pushing in a hold button.

Although the circuit is mainly intended for use as a detector for the swingers, it can also be used as a continuity tester. In such case, by way of example, with switch 52 set to the reference position and low and high adjust set to their initial positions, set the reference adjust to 0 OHMS. Adjust the low adjust until the alarm sounds. Return switch 52 to the circuit position. The device would then be moved around the premises and at each location a measurement would be made. If the circuit is intact, the alarm will sound. Otherwise, no alarm will sound indicating the absence of continuity at that point.

There has been disclosed heretofore the best embodiment of the invention presently contemplated. However, it is to be understood that various changes and modifications may be made thereto without departing from the spirit of the invention.

We claim:

1. A burglar alarm fault detector comprising, input means for coupling across a burglar alarm circuit, measuring means for measuring the actual resistance through the burglar alarm circuit as detected at the input means, alarm means, setting means for setting a desired resistance value below the actual measured resistance value and a desired resistance value above the actual measured resistance value, low end adjustment means for setting the alarm means to sound at the set resistance value below the actual measured resistance value, and high end adjustment means for setting the alarm means to sound at the set resistance value above the actual measured resistance value, and further comprising variable resistance setting means, switch means for switching said input means between the burglar alarm circuit and the variable resistance setting means, said variable resistance setting means capable of being set at a resistance value above and below the initially measured resistance value of the alarm circuit.

2. A burglar alarm fault detector as in claim 1, and comprising a housing containing said fault detector, and wherein said measuring means comprising an ohmmeter for coupling to said housing, said ohmmeter comprising readout means for displaying the resistance through the burglar alarm circuit.

3. A burglar alarm fault detector as in claim 2, wherein said fault detector comprises range setting means for adjusting the detector to match the ohmmeter.

4. A burglar alarm fault detector as in claim 3, wherein said range setting means comprises means for adjusting the range setting and indicator means which gives an indication when the proper match is reached.

5. A burglar alarm fault detector as in claim 1, and further comprising a housing containing said fault detector, and wherein said measuring means comprises an ohmmeter in said housing and a readout on said housing for displaying the resistance measured.

6. A burglar alarm fault detector as in claim 1, and comprising display means for displaying the resistance measured.

7. A burglar alarm fault detector as in claim 1, and comprising a low value comparison means for comparing a low value resistance set on said variable resistance setting means with the low end adjustment means, and a high value comparson means for comparing the high value resistance set on said variable resistance setting means with the high end adjustment means, the output from said low and high value comparison means triggering said alarm means.

8. A burglar alarm fault detector as in claim 1, and comprising oscillation means coupled to the output of at least one of said low and high end adjustment means, whereby when said alarm means sounds from at least one of said low and high resistance values, the sound will oscillate.

9. A burglar alarm fault detector as in claim 1, and comprising hold means coupled to said low and high end adjustment means for prolonging the sound response of the alarm means after detecting a fault on the burglar alarm circuit.

10. A burglar alarm fault detector as in claim 9, and comprising switch means for selective elimination of said hold means from the circuit.

11. A burglar alarm fault detector as in claim 1, wherein said alarm means comprises a transmitter, and a remotely located receiver which includes an audible device, the receiver being transportable by the user.

* * * * *